United States Patent
Yi et al.

(12) 
(10) Patent No.: US 6,610,554 B2
(45) Date of Patent: Aug. 26, 2003

(54) METHOD OF FABRICATING ORGANIC ELECTROLUMINESCENT DISPLAY

(75) Inventors: Seung-jun Yi, Seoul (KR); Do-hyun Choi, Seoul (KR); Kyung-hee Choi, Seoul (KR)

(73) Assignee: Hyung Se Kim, Kyunggi-Do (KR)

( * ) Notice: Subject to any disclaimer, the term of this patent is extended or adjusted under 35 U.S.C. 154(b) by 0 days.

(21) Appl. No.: 10/119,780

(22) Filed: Apr. 11, 2002

(65) Prior Publication Data

US 2002/0187255 A1 Dec. 12, 2002

(30) Foreign Application Priority Data

Apr. 18, 2001 (KR) .................... 2001-0020689
Mar. 18, 2002 (KR) .................... 2002-0014622

(51) Int. Cl.[7] ............................................. H01L 21/00
(52) U.S. Cl. .............................. 438/33; 438/22; 438/34; 438/47; 427/289; 427/290
(58) Field of Search ......................... 438/22, 33, 34, 438/35, 23, 24, 25, 26, 27, 28, 29–32, 36–47; 427/289, 290, 292

(56) References Cited

U.S. PATENT DOCUMENTS

| 4,769,292 | A |   | 9/1988 | Tang et al. |
| 5,294,870 | A |   | 3/1994 | Tang et al. |
| 5,399,502 | A |   | 3/1995 | Friend et al. |
| 5,475,514 | A | * | 12/1995 | Salerno et al. ................ 359/41 |
| 5,807,627 | A |   | 9/1998 | Friend et al. |
| 6,097,147 | A |   | 8/2000 | Baldo et al. |
| 6,100,104 | A | * | 8/2000 | Haerle ......................... 438/33 |
| 6,188,420 | B1 | * | 2/2001 | Kuribayashi et al. ....... 347/132 |
| 2002/0068373 | A1 | * | 6/2002 | Lo et al. ...................... 438/33 |
| 2002/0158577 | A1 | * | 10/2002 | Shimoda et al. ............ 313/506 |

* cited by examiner

Primary Examiner—Matthew Smith
Assistant Examiner—Renzo N. Rocchegiani
(74) Attorney, Agent, or Firm—Birch, Stewart, Kolasch & Birch, LLP

(57) ABSTRACT

Described is a method of fabricating an organic electroluminescent display (hereinafter abbreviated OELD) enabling to increase a throughput efficiency by carrying out a foregoing OELD process, dividing a large-scaled substrate, and carrying out a following OELD process in order. The present invention includes the steps of forming a first electrode layer on a large-scaled substrate, dividing the large-scaled substrate into a plurality of small substrates, forming an organic electroluminescent layer on the first electrode layer of at least one of the small substrates, and forming a second electrode layer on the organic electroluminescent layer.

16 Claims, 7 Drawing Sheets

METHOD OF FABRICATING ORGANIC ELECTROLUMINESCENT DISPLAY

BACKGROUND OF THE INVENTION

1. Field of the Invention

The present invention relates to an organic electroluminescent display, and more particularly, to a method of fabricating an organic electroluminescent display (hereinafter abbreviated OELD) enabling to increase a throughput efficiency by carrying out a foregoing OELD process, dividing a large-scaled substrate, and carrying out a following OELD process in order.

2. Background of the Related Art

As information telecommunication technologies have been greatly developed, demands for electronic display devices are highly increased to keep up with the developing information society. And, so does the demands for various displays. In order to satisfy the demands of the information society, for electronic display devices are required characteristics such as high-resolution, large-size, low-cost, high-performance, slim-dimension, and small-size and the like, for which new flat panel displays (hereinafter abbreviated FPD) are developed as substitutions for the conventional cathode ray tube (CRT).

The FPDs include LCD (liquid crystal display), ELD (electroluminescent display), PDP (plasma display panel), FED (field emission display), VFD (vacuum fluorescence display), and LED (light emitting display), and the like.

Compared to the non-emissive device such as LCD, ELD attracts attention as the next generation FPD because ELD has a response speed faster than that of the non-emissive display, excellent brightness by self-luminescence, easy fabrication thanks to a simple structure, and light-weight/slim design. Thus, ELD is widely applied to various fields such as LCD backlight, mobile terminal, car navigation system (CNS), notebook computer, wall TV, and the like.

Such an ELD is divided into two categories, i.e. organic electroluminescent display (hereinafter abbreviated OELD) and inorganic electroluminescent display (hereinafter abbreviated IELD) in accordance with materials used for luminescent layers respectively.

IELD, which emits light using the collisions of electrons accelerated by an high electric filed, is classified into AC thin film ELD, AC thick film ELD, DC thick film ELD, and the like in accordance with thickness of the thin films and driving systems.

And, OELD, which emits light by a current flow, is classified into low-molecular OELD and high-molecular OELD.

FIG. 4 illustrates a schematic cross-sectional view of OELD according to a related art.

Referring to FIG. 4, stacked on a transparent substrate 11 in order are a transparent anode layer 12, a hole injection layer 13, a hole transport layer 14, an organic luminescent layer 15, an electron transport layer 17, and a cathode layer 18 made of metal. And, the organic luminescent layer 15 emits light by a current flow. The hole injection, hole transport, and electron transport layers 13, 14, and 17 play a subsidiary role in increasing a luminescence efficiency of OELD.

The hole injection, hole transport, organic luminescent, and electron transport layers 13, 14, 15, and 17 are formed by vacuum deposition using a shadow mask if formed of a low molecular material. And, the hole transport, and organic luminescent layers 14, and 15 are formed by ink-jet or printing if formed of a high molecular material. The limitation of the deposition or printing equipment restricts the size of a substrate. The maximum size of the substrate enabling to use the current deposition or printing equipment for the deposition or printing is 370 mm×470 mm or 400 mm×400 mm.

OELD is classified into the following devices in accordance with the luminescent (light-emitting) materials. First, there is a fluorescent display disclosed in U.S. Pat. Nos. 4,769,292 and 5,294,870, in which the organic luminescent layer 15 is formed of a fluorescent emitting material such as aluminum tris(8-hydroxyquinoline) (Alq3), perylene or the like. Second, there is phosphorescent OELD disclosed in U.S. Pat. No. 6,097,147, in which the organic luminescent layer 15 is formed of one of phosphorescent emitting materials such as platinum 2,3,7,8,12,12,17,18-octaethyl-21H,23H-porphine platinum (PtOEP), iridium complex {ex. Ir (Ppy) 3} and a blocking layer is formed between the hole and electron transport layers 14 and 17 using one of bathocuproine (BCP), cabazole biphenyl (CBP), N,N'-diphenyl-N,N'-bis-alpha-napthylbenzylidine (NPD), and the like. Specifically, high molecular OELD has a double-layered structure including hole transport/electroluminescent layers 14/15 between the transparent anode and cathode layers 12 and 18, for which conductive high molecules of conjugated polymer disclosed in U.S. Pat. No. 5,399,502 and U.S. Pat. No. 5,807,627 are used. The conductive polymer includes {poly(p-phenylenevinylene), PPV}, poly(thiophene), {poly (2,5-dialkoxyphenylenevinylene, PDMeOPV)}, and the like.

Luminescent wavelengths of the representative organic electroluminescent materials are shown in Table 1.

TABLE 1

| Organic electroluminescent material | Wavelength of emitting light |
| --- | --- |
| 4,4-bis (2,2'-diphenylethen-4-yl)-diphenyl | 465 nm |
| Tris (8-hydroxyquinoline) aluminum | 520 nm |
| bis (8-hydroxyquinoline) magnesium | 515 nm |
| Coumarine 6 | 503 nm |
| Rubrene | 560 nm |
| poly (p-phenylenevinylene), PPV | 540 n |

Such OELD is classified into active and passive types according to its driving system. If the panel size of the passive type OELD driven by current increases, an efficiency of power consumption as well as device reliance decreases. In order to settle such problems, if a diagonal diameter of a panel is at least 10", the active type OELD using polysilicon thin film transistors (hereinafter abbreviated TFT) is used.

Unfortunately, OELD according to the related art has the following problems or disadvantages.

The electroluminescent layer of OELD is formed by deposition using a shadow mask or printing. Thus, the limitation of equipments of deposition or printing restricts the size of the substrate. The available size of the substrate is maximum 370 mm×470 mm or 400 mm×400 mm.

Therefore, such a restriction of the substrate size also restricts productivity (throughput) of OELD so as to increase a product cost.

SUMMARY OF THE INVENTION

Accordingly, the present invention is directed to a method of fabricating an organic electroluminescent display that substantially obviates one or more of the problems due to limitations and disadvantages of the related art.

An object of the present invention is to provide a method of fabricating an organic electroluminescent display (hereinafter abbreviated OELD) enabling to increase a throughput efficiency by carrying out a foregoing OELD process, dividing a large-scaled substrate, and carrying out a following OELD process in order.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages, and in accordance with the purpose of the present invention as embodied and broadly described, a method of fabricating an organic electroluminescent display includes the steps of forming a first electrode layer on a large-scaled substrate, dividing the large-scaled substrate into a plurality of small substrates, forming an organic electroluminescent layer on the first electrode layer of at least one of the small substrates, and forming a second electrode layer on the organic electroluminescent layer.

In another aspect of the present invention, a method of fabricating an organic electroluminescent display includes the steps of forming a driving part including a plurality of transistors and at least one capacitor and having a first electrode layer on a large-scaled substrate, dividing the large-scaled substrate into a plurality of small substrates, forming an organic electroluminescent layer on the first electrode layer of the driving part of at least one of the small substrates, and forming a second electrode layer on the organic electroluminescent layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1A:
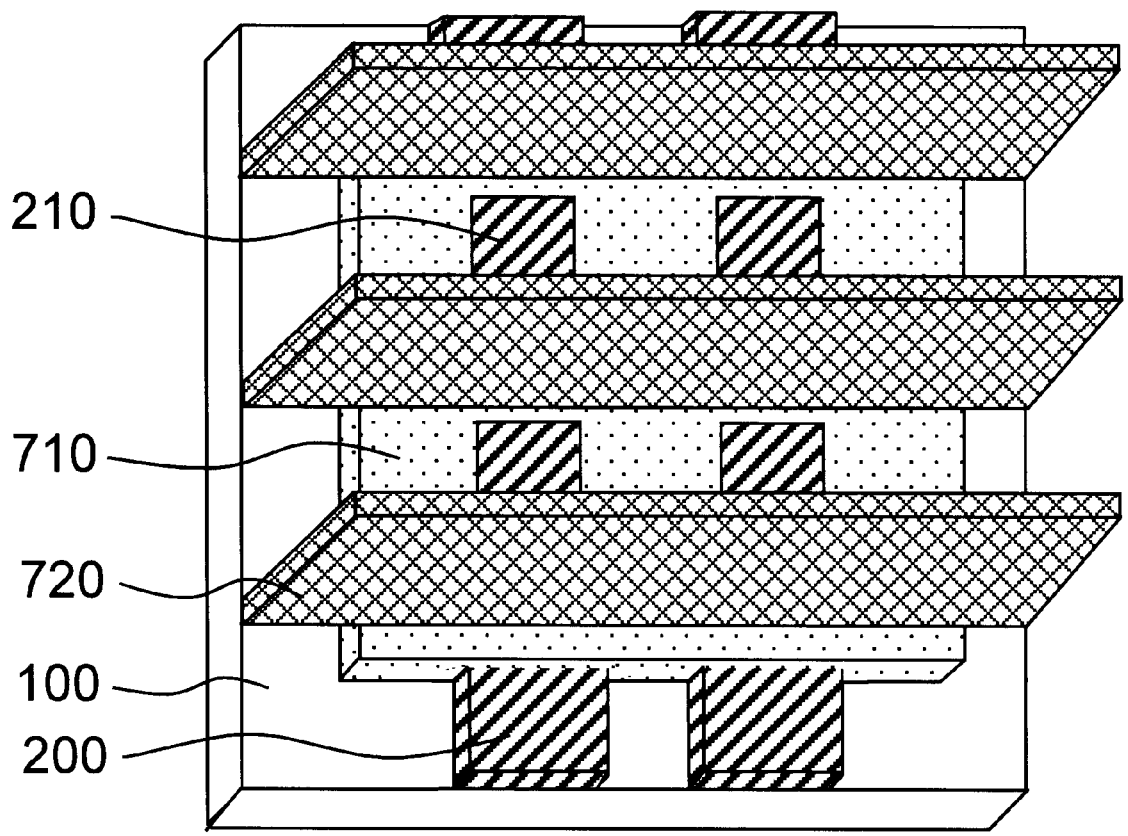
FIG. 1A illustrates a bird's-eye view of a passive type OELD according to a first embodiment of the present invention.

Reference will now be made in detail to the preferred embodiments of the present invention, examples of which are illustrated in the accompanying drawings. Where possible, the same reference numerals will be used to illustrate like elements throughout the specification. And, detailed component materials and techniques of the embodiments of the present invention include all those used for the related art.

First Embodiment

A method of fabricating a passive type organic electroluminescent display (hereinafter abbreviated OELD) according to a first embodiment of the present invention is described as follows.

Figure 1B:
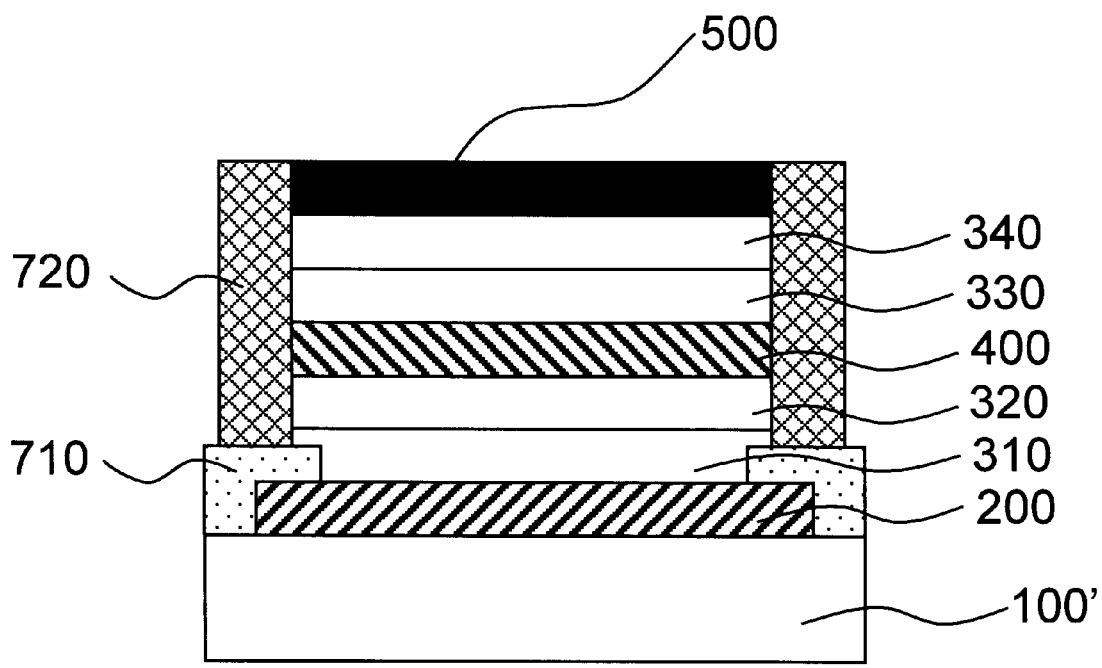
FIG. 1B illustrates a cross-sectional view of a passive type OELD according to a first embodiment of the present invention.

FIG. 1A illustrates a bird's-eye view of a passive type OELD according to a first embodiment of the present invention, and FIG. 1B illustrates a cross-sectional view of a passive type OELD according to a first embodiment of the present invention.

Referring to FIG. 1A, an ITO (indium tin oxide) layer (not shown in the drawing) is formed on a large-scaled substrate 100 made of transparent plastic or glass. In this case, a size of the substrate 100 includes 740 mm×940 mm. The ITO layer is coated with photoresist. After the photoresist is developed, an anode layer 200 is formed stripe-like by etching the ITO layer.

After a dielectric layer is formed on the anode layer 200, a photoresist layer (not shown in the drawing) is coated on the insulating layer 710 to pattern the dielectric layer 710. Exposure and development are carried out on the photoresist layer so as to form a photoresist pattern (not shown in the drawing). The dielectric layer 710 is etched using the photoresist pattern so as to form a plurality of openings 210 exposing predetermined portions of the anode layer 200. In this case, the openings 210 over the anode layer 710 are left apart from each other with predetermined intervals.

A photoresist for separators is coated on the dielectric layer 710. Exposure and development are carried out on the photoresist for separators, and a high thermal baking process is carried out thereon so as to form a plurality of separators 720 on the dielectric layer. In this case, the separators 720 are formed so as to be vertical to the anode layer 200.

In this case, when the anode layer 200, dielectric layer 710, and separators 720 are formed, a scribing lane (not shown in the drawing) is prepared to cut the large-scaled substrate 100. A width of the scribing lane is between 50 μm~1 mm.

The 740 mm×940 mm large-scaled substrate 100 is cut so as to be divided into four 370 mm×470 mm small substrates 100' suitable for deposition. The large-scaled substrate 100 is cut using one of laser, supersonic waves, diamond, and the like. In order to remove particles generated from the cutting process of the large-sized substrate 100, a cleaning process is carried out using wet cleaning, dry cleaning of UV or plasma, or both wet and dry cleaning.

Referring to FIG. 1B, a hole injection layer 310 is formed with CuPC, m-MTDATA, or the like on the anode layer 200 exposed through a plurality of the openings 210 over the small substrate 100' of 370 mm×470 mm using a shadow mask. And, a hole transport layer 320 is formed with NBP on the hole injection layer 310 using a shadow mask.

And, an organic electroluminescent layer 400 is formed on the hole transport layer 320 using a shadow mask so as to include red, green, and blue pixels. In this case, the red pixel is formed using Alq3+DCJTB or the like, the green pixel is formed using Alq3+Qd2 or the like, and the blue pixel is formed using Blq+perylene or the like. An electron transport layer 330 is formed with a material such as Alq3 or the like on the organic electroluminescent layer 400 using a shadow mask.

Subsequently, an electron injection layer 340 is formed on the electron transport layer 330. A cathode layer 500 is then formed by vacuum deposition using a metal such as Al. In this case, the electron injection layer 340 prevents the injected holes from flowing into the cathode, and improves electron injection efficiency from the cathode, thereby increasing a luminescent efficiency. Further, a passivation layer (not shown in the drawing) may preferably be formed on the cathode layer 500 using an organic or inorganic material, or a metal or glass cap (not shown in the drawing) to which a desiccant is attached may be installed on the cathode layer 500.

Moreover, for OELD using polymer, organic electroluminescent and subsidiary layers of thin films are formed by ink jet, printing, spin coating or the like. And, materials for the thin films include the foregoing-mentioned materials. Low molecular materials include the foregoing-mentioned materials as well.

On the other hand, the cathode layer 500 may be formed prior to the anode layer 200 in the first embodiment of the present invention.

Second Embodiment

A method of fabricating a passive type organic electroluminescent display having auxiliary electrodes according to a second embodiment of the present invention is described as follows.

Figure 2A:
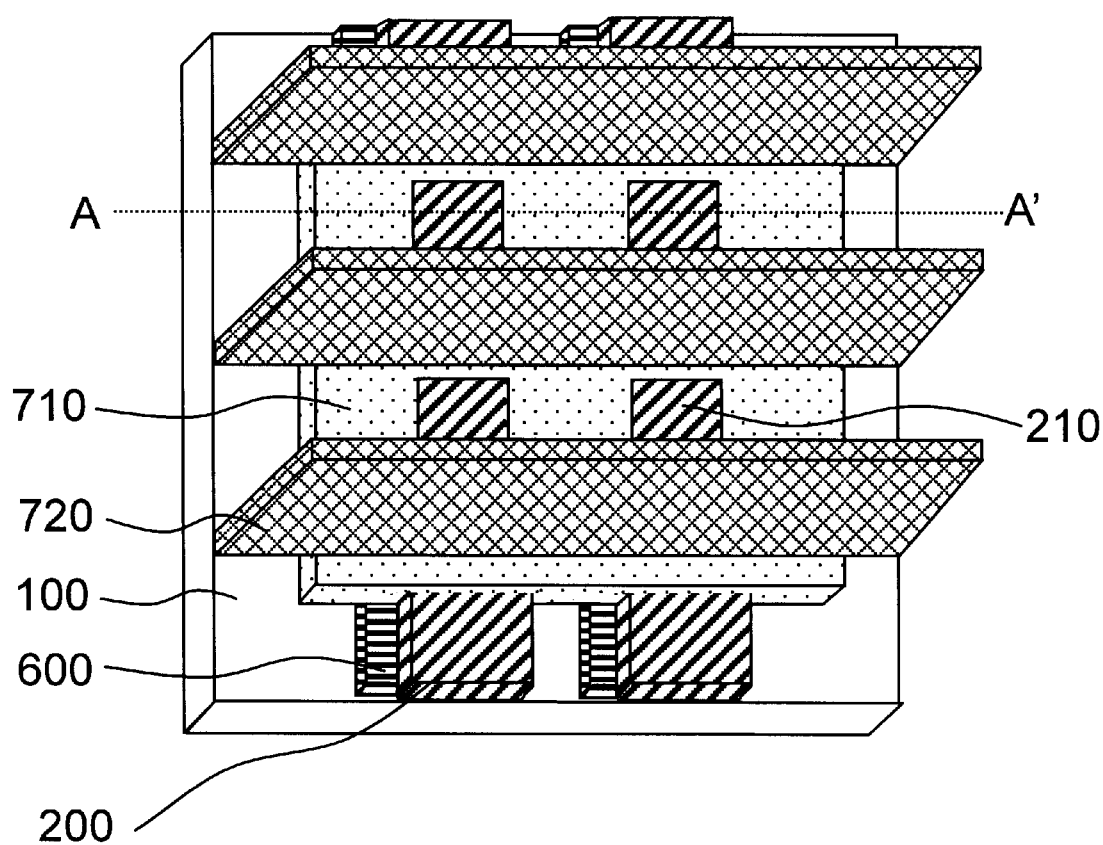
FIG. 2A illustrates a bird's-eye view of a passive type OELD according to a second embodiment of the present invention.
Figure 2B:
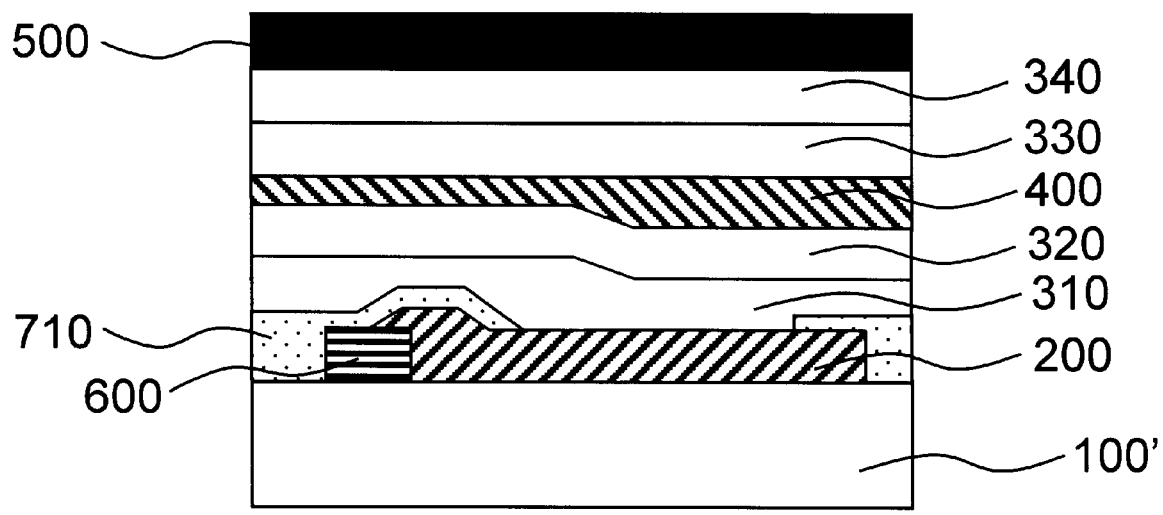
FIG. 2B illustrates a cross-sectional view of a passive type OELD according to a second embodiment of the present invention.

FIG. 2A illustrates a bird's-eye view of a passive type OELD according to a second embodiment of the present invention, and FIG. 2B illustrates a cross-sectional view of a passive type OELD bisected along a cutting line a–a' in FIG. 2A according to a second embodiment of the present invention, in which separators are not shown.

Referring to FIG. 2A, a large-scaled substrate 100 formed of a transparent plastic or glass is cleaned. In this case, a size of the substrate 100 may be 740 mm×940 mm. A metal layer such as Cr, W, Mo, MoW, Al, or the like is deposited on the large-scaled substrate 100 by sputtering. A photoresist pattern is formed on the metal layer by coating, exposure and development. The metal layer is etched using the photoresist pattern as a mask so as to form auxiliary electrodes 600 like stripes. The auxiliary electrodes 600 are formed to reduce resistance of the following anode layer 200.

And, using the same method of the first embodiment of the present invention, a dielectric layer 710 and separators 720 are formed on the large-scaled substrate 100 including the anode layer 200 in order. A scribing lane (not shown in the drawing) is then prepared to cut the large-scaled substrate 100. A width of the scribing lane is between 50 μm~1 mm.

After an ITO (indium tin oxide) layer is formed on the large-scaled substrate 100 including the auxiliary electrodes 600, a photoresist layer (not shown in the drawing) is coated on the ITO layer. Exposure and development are carried out on the photoresist layer so as to form a photoresist pattern (not shown in the drawing). The ITO layer is etched using the photoresist, pattern so as to form the anode layer 200 on the auxiliary electrodes 600. In this case, the anode layer 200 is formed stripe-like so as to be parallel to the auxiliary electrodes 600.

The 740 mm×940 mm large-scaled substrate 100 is cut so as to be divided into four 370 mm×470 mm small substrates 100' suitable for deposition. The large-scaled substrate 100 is cut using one of laser, supersonic waves, diamond, and the like. In order to remove particles generated from the cutting process of the large-sized substrate 100, a cleaning process is carried out using wet cleaning, dry cleaning of UV or plasma, or both wet and dry cleaning.

Subsequently, as is the case with the first embodiment of the present invention, hole injection, hole transport, electroluminescent, electron transport, and electron injection layers 310, 320, 400, 330, and 340 are formed on the small substrate 100' of 370 mm×470 mm. In this case, theses layers are formed by vacuum deposition in case of low molecules or one of ink-jet, printing, and spin-coating in case of high molecules. And, a cathode layer 500 is formed on the electron injection layer 340 by vacuum deposition. An encapsulation or passivation layer is then formed.

On the other hand, the anode layer 200 may be formed on the large-scaled substrate 100 prior to the auxiliary electrodes 600 in the second embodiment of the present invention.

Operation of the passive type OELD according to the first and second embodiments of the present invention is explained as follows. When a voltage is applied to anode and cathode electrodes, holes injected through the hole transport layer meet electrons injected through the electron transport layer at the electroluminescent layer so as to be combined with each other. Then, the excited electrons drop to a ground state so as to emit light.

In the first and second embodiments of the present invention, at least one OELD is fabricated on the small substrate of 370 mm×470 mm separated from the large-scaled substrate of 740 mm×940 mm in accordance with its size.

And, a size of the large-scaled substrate used for the first or second embodiment of the present invention may be greater or smaller than 740 mm×940 mm. Besides, a size of each of the small substrates separated from the large-scaled substrate may be greater or smaller than 370×470 mm in consideration of the various deposition equipments. Moreover, the number of the small substrates is unnecessary to be four, which may be greater or smaller than four. And, the substrate includes a wafer and the like as well as the transparent substrate.

Third Embodiment

A method of fabricating an active type organic electroluminescent display according to a third embodiment of the present invention is described as follows.

Count and arrangement of transistors and capacitors in an active type OELD vary in accordance with the structure thereof. Hereinafter, a method of fabricating an active type OELD including driving transistors, switching transistors, and capacitors is explained in the following description.

Figure 3A:
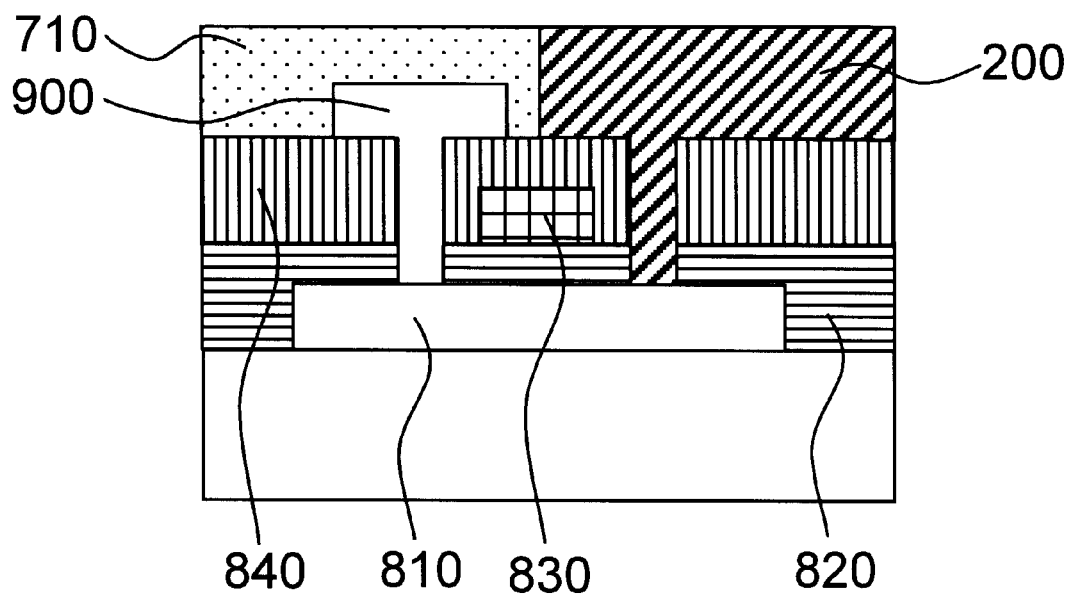
FIG. 3A and FIG. 3B illustrate cross-sectional view of fabricating active type OELD according to a third embodiment of the present invention.
Figure 3B:
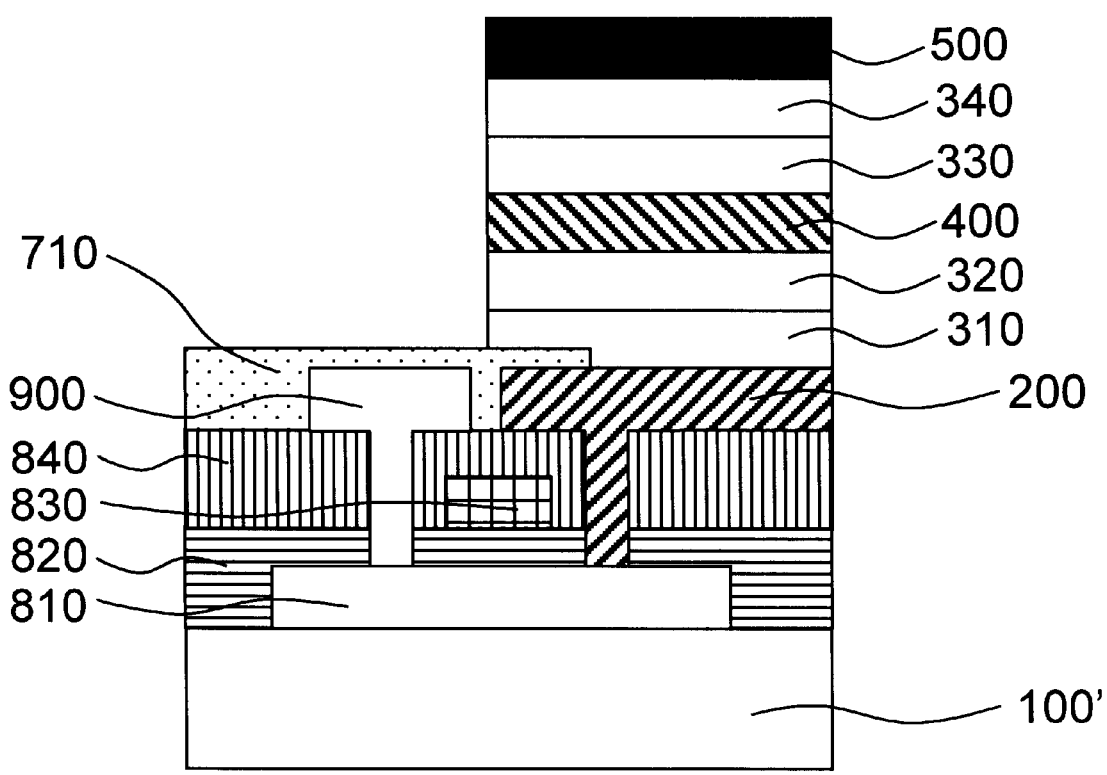
Figure 4:
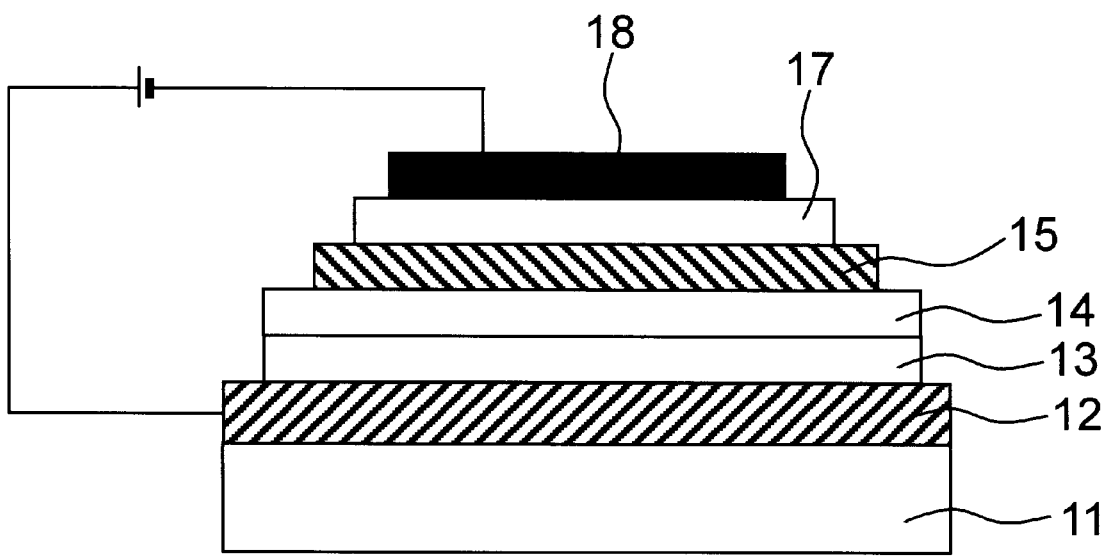
FIG. 4 illustrates a schematic cross-sectional view of OELD according to a related art.

FIG. 3A and FIG. 3B illustrate cross-sectional view of fabricating active type OELD according to a third embodiment of the present invention.

A dielectric layer (not shown in the drawing) is formed on a large-scaled substrate 100 using silicon oxide ($SiO_2$). And, an active layer 810 of polysilicon is formed on the dielectric layer. In this case, the dielectric layer is formed by sputtering or chemical vapor deposition. And, the active layer 810 is formed by depositing a silicon layer by sputtering or CVD and then carrying out laser annealing on the silicon layer so as to form a polysilicon layer.

The active layer 810 is then patterned like islands using photolithography. A gate insulating layer 820 is formed on the active layer 810 and the dielectric layer by sputtering or CVD. A metal layer is formed on the gate insulating layer 820 by sputtering or CVD, and then patterned so as to form a gate electrode 830. In this case, the gate electrode 830 remains on the gate insulating layer 820 corresponding to the active layer 810.

Ion doping and thermal treatment are carried out on the active layer 810 so as to define source and drain regions (not shown in the drawing) at the active layer 810. Subsequently, a second dielectric layer 840 is formed on the substrate 100 including the gate insulating layer 820 and gate electrode 830. Portions of the second dielectric layer 840 and gate insulating layer 820 corresponding to the source and drain regions are then etched selectively so as to form contact holes.

Subsequently, bus and ITO electrodes 900 and 200 are formed in the contact holes corresponding to the source and drain regions of a driving thin film transistor, respectively. A signal line is formed on a bus electrode 900 of a source region of a switching thin film transistor, and a storage electrode is formed at the gat electrode of the driving device and the drain region of the switching device so as to be electrically connected to a capacitor. In this case, the ITO electrode 200 is used as the anode layer for organic electroluminescence.

In order to construct a display part on the fabricated driving part, a passivation layer 710 is formed on a top of the resulting structure having the driving part and a portion of the passivation layer 710 is then etched so as to expose a portion of the ITO electrode 200.

When the active layer 810, gate insulating layer 820, gate electrode 830, and so forth are formed on the large-scaled substrate 100, a scribing lane (not shown in the drawing) is prepared to cut the large-scaled substrate 100. A width of the scribing lane is between 50 $\mu$m~1 mm.

The 740 mm×940 mm large-scaled substrate 100 is cut so as to be divided into four 370 mm×470 mm small substrates 100' suitable for deposition. The large-scaled substrate 100 is cut using one of laser, supersonic waves, diamond, and the like. In order to remove particles generated from the cutting process of the large-sized substrate 100, a cleaning process is carried out using wet cleaning, dry cleaning of UV or plasma, or both wet and dry cleaning.

Subsequently, as is the case with the first or second embodiment of the present invention, hole injection, hole transport, electroluminescent, electron transport, and electron injection layers 310, 320, 400, 330, and 340 are formed on the small substrate 100' of 370 mm×470 mm. In this case, theses layers are formed by vacuum deposition in case of low molecules or one of ink-jet, printing, and spin-coating in case of high molecules. And, a cathode layer 500 is formed on the electron injection layer 340 by vacuum deposition. An encapsulation or passivation layer is then formed so as to fabricate, as shown in FIG. 3B, the active type OELD having the driving part.

In the third embodiment of the present invention, at least one OELD is fabricated on the small substrate of 370 mm×470 mm separated from the large-scaled substrate of 740 mm×940 mm in accordance with a size of the active type OELD.

And, a size of the large-scaled substrate used for the third embodiment of the present invention may be greater or smaller than 740 mm×940 mm. Besides, a size of each of the small substrates separated from the large-scaled substrate may be greater or smaller than 370×470 mm in consideration of the various deposition equipments. Moreover, the number of the small substrates is unnecessary to be four, which may be greater or smaller than four.

The cathode layer 500 can be formed prior to the ITO electrode 200 used as the anode layer. And, the substrate includes a silicon wafer and the like as well as the transparent substrate.

Operation of the active type OELD according to the third embodiment of the present invention is explained as follows. When a voltage is applied to anode and cathode electrodes of a pixel selected by a thin film transistor, holes injected through the hole transport layer meet electrons injected through the electron transport layer at the electroluminescent layer so as to be combined with each other. Then, the excited electrons drop to a ground state so as to emit light.

Accordingly, a method of fabricating OELD according to the present invention has the following advantages or effects.

The present invention is mainly divided into the foregoing process requiring no deposition or printing equipment for forming the organic luminescent and its auxiliary layers and the following process requiring the deposition or printing equipment for forming the organic luminescent and its auxiliary layers. After having been prepared and carrying out the foregoing process, the large-scaled substrate is cut into small substrates having sizes suitable for deposition or printing in order to form the electroluminescent and auxiliary layers requiring the deposition or printing equipment. Successively, the electroluminescent and auxiliary layers are formed on the small substrate by deposition or printing.

Such a method of fabricating OELD overcomes the limitation of the substrate size according to a chamber size of the deposition or printing equipment so as to carry out the foregoing processes on a large-scaled substrate. Therefore, the present invention enables to improve productivity as well as reduce product cost.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating an organic electroluminescent display, comprising the steps of:
    forming a first electrode layer on a large-scaled substrate;
    dividing the large-scaled substrate into a plurality of small substrates;
    forming an organic electroluminescent layer on the first electrode layer of at least one of the small substrates; and forming a second electrode layer on the organic electroluminescent layer.

2. The method of claim 1, before dividing the large-scaled substrate, the method further comprising the steps of:
    forming an ITO layer as the first electrode layer on the large-scaled substrate;
    forming a dielectric layer having a plurality of openings exposing portions of the ITO layer; and
    forming a plurality of separators on the dielectric layer so as to be vertical to the ITO layer.

3. The method of claim 1, wherein a size of the large-scaled substrate is 740 mm×940 mm and a size of each of the small substrates is 370 mm×470 mm.

4. The method of claim 1, wherein the large-scaled substrate is divided using one of laser, supersonic waves, and diamond.

5. The method of claim 1, further comprising the step of carrying out a cleaning process after dividing the large-sized substrate.

6. The method of claim 1, wherein the first and second electrode layers are used as anode and cathode layers, respectively, and vice versa.

7. The method of claim 1, further comprising the step of forming a subsidiary electrode layer beneath or onto the first electrode layer.

8. The method of claim 1, wherein the organic electroluminescent layer includes hole injection, hole transport, electroluminescent, and electron injection layers.

9. The method of claim 1, further comprising the step of forming an encapsulation or passivation layer on the second electrode layer.

10. A method of fabricating an organic electroluminescent display, comprising the steps of:

forming a driving part including a plurality of transistors and at least one capacitor and having a first electrode layer on a large-scaled substrate;

dividing the large-scaled substrate into a plurality of small substrates;

forming an organic electroluminescent layer on the first electrode layer of the driving part of at least one of the small substrates; and forming a second electrode layer on the organic electroluminescent layer.

11. The method of claim 10, wherein a cutting area is prepared to divide the large-scaled substrate and a width of the cutting area lies between 50 $\mu$m~1 mm.

12. The method of claim 10, wherein the driving part on the large-scaled substrate comprises a driving transistor, a switching transistor, and a capacitor.

13. The method of claim 10, the step of forming the driving part comprising the steps of:

forming a dielectric layer and an active layer on the large-scaled substrate in order;

forming a gate insulating layer on the active layer and the dielectric layer;

forming a gate electrode on the gate insulating layer corresponding to the active layer;

forming a source and a drain at the active layer;

forming a second dielectric layer on the large-scaled substrate including the gate insulating layer and gate electrode;

forming contact holes by etching selectively the second dielectric and gate insulating layers corresponding to the source and drain;

forming bus and first electrodes at the contact holes corresponding the source and drain of the driving transistor, respectively; and forming a signal line on the bus electrode of the source of the switching transistor and a storage electrode at the gate electrode of the driving transistor and the drain of the switching transistor so as to be connected to the capacitor.

14. The method of claim 10, wherein the first and second electrode layers are used as anode and cathode layers, respectively, and vice versa.

15. The method of claim 10, wherein the organic electroluminescent layer includes hole injection, hole transport, electroluminescent, and electron injection layers.

16. The method of claim 10, further comprising the step of forming one of encapsulation and passivation layers on the second electrode layer.

* * * * *